United States Patent
Kato et al.

(10) Patent No.: US 7,639,055 B2
(45) Date of Patent: Dec. 29, 2009

(54) PWM SIGNAL GENERATOR

(75) Inventors: Masayuki Kato, Yokkaichi (JP); Seiji Takahashi, Yokkaichi (JP); Masahiko Furuichi, Yokkaichi (JP); Isao Isshiki, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/083,621

(22) PCT Filed: Oct. 17, 2006

(86) PCT No.: PCT/JP2006/320626
§ 371 (c)(1),
(2), (4) Date: Apr. 29, 2008

(87) PCT Pub. No.: WO2007/046363
PCT Pub. Date: Apr. 26, 2007

(65) Prior Publication Data
US 2009/0108894 A1    Apr. 30, 2009

(30) Foreign Application Priority Data
Oct. 17, 2005    (JP) ............................. 2005-301694

(51) Int. Cl.
*H03K 3/017* (2006.01)
(52) U.S. Cl. ........................................ 327/172; 327/175
(58) Field of Classification Search .................. None
See application file for complete search history.

(56) References Cited

U.S. PATENT DOCUMENTS

| | | | | | |
|---|---|---|---|---|---|
| 5,173,847 | A | * | 12/1992 | Suzuki | 363/21.14 |
| 5,436,820 | A | * | 7/1995 | Furmanczyk | 363/49 |
| 6,044,003 | A | * | 3/2000 | Toshinari et al. | 363/97 |
| 6,690,591 | B2 | * | 2/2004 | Min | 363/97 |
| 6,812,916 | B2 | * | 11/2004 | Hwang | 345/102 |
| 6,969,183 | B2 | * | 11/2005 | Okubo et al. | 362/466 |
| 7,002,385 | B2 | * | 2/2006 | Gotzenberger | 327/175 |
| 2007/0103276 | A1 | * | 5/2007 | Kousaka et al. | 340/388.1 |
| 2008/0258787 | A1 | * | 10/2008 | Takahashi et al. | 327/175 |

FOREIGN PATENT DOCUMENTS

| | | |
|---|---|---|
| JP | A 5-168164 | 7/1993 |
| JP | A 11-41077 | 2/1999 |
| JP | A 11-97989 | 4/1999 |
| JP | A 2003-188693 | 7/2003 |

* cited by examiner

*Primary Examiner*—Cassandra Cox
(74) *Attorney, Agent, or Firm*—Oliff & Berridge, PLC

(57) ABSTRACT

After an output signal S4 is level-inverted, first and second shorting FETs 55, 56 as a level-inversion inhibiting circuit inhibit level-inversion so that the signal is maintained to the inverted state. Thereafter the inhibition of level-inversion is released, when the signal is subsequently level-inverted at a proper time according to a desired duty ratio of a PWM signal S1. Thus chattering can be prevented and thereby a PWM signal S1 of a stable duty ratio can be generated, even if the level of a reference signal S3 fluctuates due to a noise or the like during vehicle acceleration, for example.

8 Claims, 3 Drawing Sheets

PWM SIGNAL GENERATOR

TECHNICAL FIELD

The present invention relates to a PWM signal generator.

BACKGROUND ART

Various nations have safety standards for vehicle headlamps, for example, which require that headlamps are on, even during a daytime drive, with an intensity of a predetermined ratio (e.g., 25%) to that during a night drive. In view of this, there has been proposed a daylight system for lighting headlamps during daytime by PWM control with an intensity of a predetermined ratio to that during nighttime. A construction for the PWM control is disclosed in Japanese Patent Laid-Open No. 2003-188693, for example. In the construction, based on the interterminal voltage of a capacitor that repeats charge and discharge, a triangular wave signal is provided for a hysteresis comparator. The hysteresis comparator compares in magnitude the level of the triangular wave signal with two threshold voltages provided therein, and outputs an output signal as a PWM signal according to level inversion of the magnitude relation. Thus the hysteresis comparator is used, and thereby chattering due to a vehicle power-supply noise or the like can be prevented when level-inversion occurs between the triangular wave signal and each of the threshold voltages.

However, in the above construction using a hysteresis comparator, the circuit constant of the hysteresis comparator may have a variation due to manufacturing reasons or the like. FIG. 3 shows a typical circuit construction that uses a hysteresis comparator. As shown in the figure, the output terminal of the comparator 1 is fed back to the positive input terminal via a feedback resistor 2, and also connected to a power-supply line 4 (+B) via a resistor 3. A triangular wave signal is applied to the negative input terminal of the comparator 1, while a divided voltage obtained by dividing a power supply voltage using resistors 5, 6 is applied as a threshold voltage to the positive input terminal. According to the construction, an output from the hysteresis comparator is directly used as a PWM signal. However, the resistance values of the resistive elements (resistors 2, 3) included in the hysteresis comparator may have a variation due to manufacturing reasons. Even if external resistors are used as the resistors 5, 6 for mitigating variation of the resistors 5, 6, the threshold voltages may vary due to variation of the resistors 2, 3 in the hysteresis comparator. Thereby times when level-inversion occurs between the triangular wave signal and each of the threshold voltages may vary, and consequently a duty ratio of the output signal (PWM signal) from the hysteresis comparator may vary from one product to another. Then a problem arises that headlamps cannot be lighted stably with a predetermined intensity during daytime.

Thus, there is a need in the art to provide a PWM signal generator capable of generating a PWM signal of a stable duty ratio with immunity from a vehicle power-supply noise, manufacturing variation of circuit constants or the like.

SUMMARY OF THE INVENTION

A PWM signal generator according to the present invention includes an oscillator circuit configured to output an oscillator signal, and a comparator circuit configured to receive the oscillator signal from the oscillator circuit and a reference signal, and further configured to output an output signal of a pulse train, which is level-inverted according to a magnitude relation between a level of the oscillator signal and a level of the reference signal, as a PWM signal for pulse width modulation control. The PWM signal generator further includes a level-inversion inhibiting circuit configured to inhibit level-inversion of the output signal, until a time before the output signal is subsequently level-inverted at a proper time according to a desired duty ratio of the PWM signal after the output signal is level-inverted, by changing, irrespective of a signal level of one of the oscillator signal and the reference signal, a level to be compared with a level of the other signal by the comparator circuit, so that the output signal is not level-inverted.

According to this construction, after the output signal is level-inverted, the level-inversion inhibiting circuit forcibly maintains the inverted state so as to inhibit level-inversion. Specifically, a level to be compared in magnitude with the level of the reference signal by the comparator circuit may be forcibly changed, irrespective of the level of the oscillator signal, to an absolutely higher level than the level of the reference signal, when the level of the oscillator signal exceeds the level of the reference signal, for example. Further, a level to be compared in magnitude with the level of the oscillator signal by the comparator circuit may be forcibly changed, irrespective of the level of the reference signal, to an absolutely higher level than the level of the oscillator signal, when the level of the oscillator signal falls below the level of the reference signal, for example.

Thereafter, the level-inversion inhibited state is released so that level-inversion is allowed before level-inversion subsequently occurs at a proper time according to a desired duty ratio of the PWM signal (i.e., a time of level inversion during a normal time when a noise or the like has not occurred). When subsequent level-inversion has occurred, the inverted state is forcibly maintained again, and thereafter the level-inversion inhibited state is released before subsequent level-inversion occurs. Thereby chattering can be prevented, even if the level of the reference signal or the oscillator signal fluctuates due to a vehicle power-supply noise or the like. Further, in contrast to a conventional construction using a hysteresis comparator, a PWM signal of a stable duty ratio can be generated, even if the circuit constants have variations due to manufacturing reasons.

BEST MODE FOR CARRYING OUT THE INVENTION

A PWM signal generator 10 according to an embodiment of the present invention generates and provides a PWM signal S1 of a desired duty ratio for a switching element (e.g., a power MOSFET or a semiconductor switching element incorporating a protective function (e.g., an IPD: intelligent power device)) connected between a power source and a load, in order to achieve ON/OFF operation. Thereby the PWM signal generator 10 performs PWM (Pulse Width Modulation) control for power supply to the load. In the present embodiment, the PWM signal generator 10 is installed on a vehicle not shown, and used for drive control for a load such as a vehicle lamp, or a motor for a cooling fan or for a wiper.

Hereinafter, the PWM signal generator 10 will be explained with reference to FIGS. 1 and 2.

1. Circuit Construction of the Present Embodiment

Figure 1:
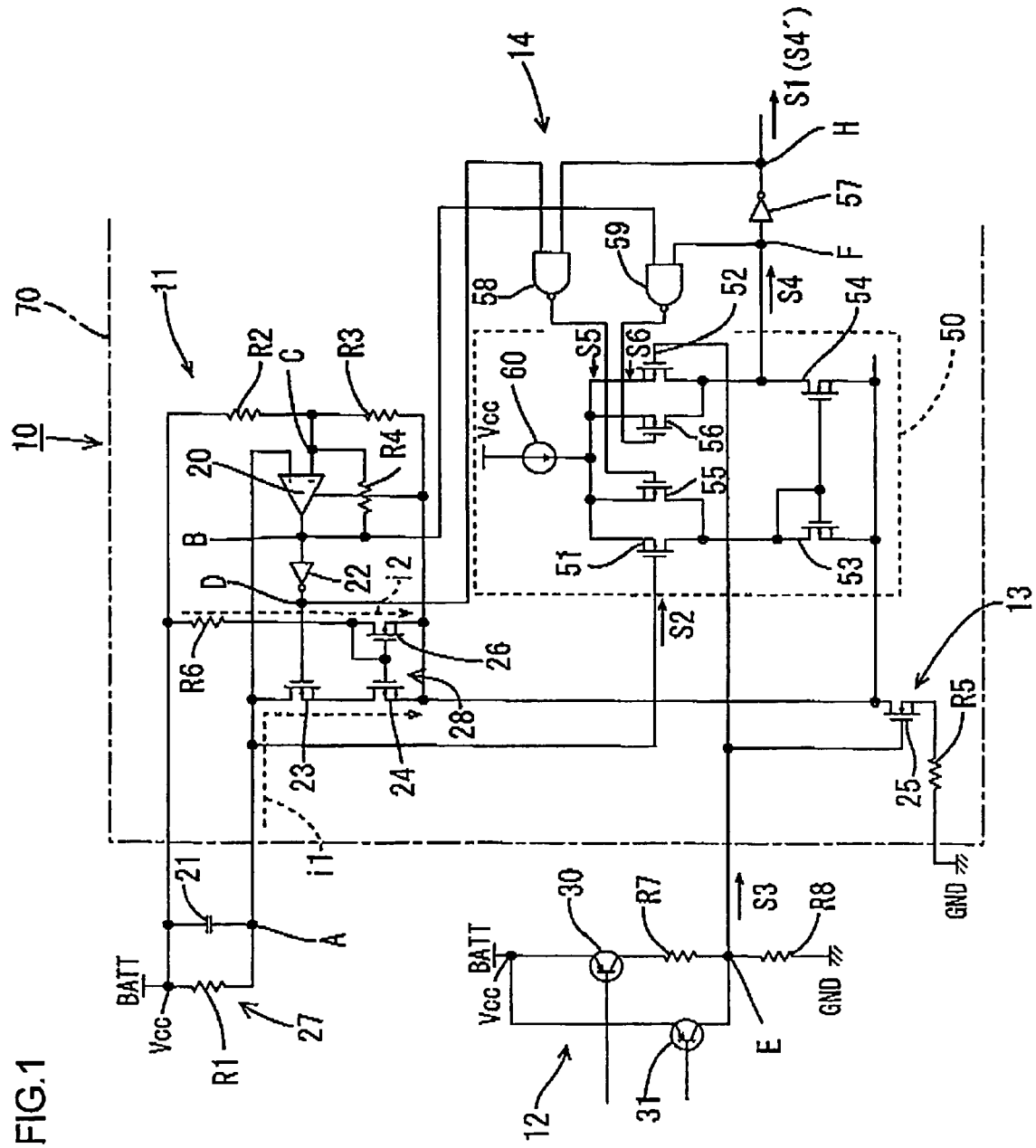
[FIG. 1] is a schematic diagram showing a PWM signal generator according to an embodiment of the present invention.
Figure 2:
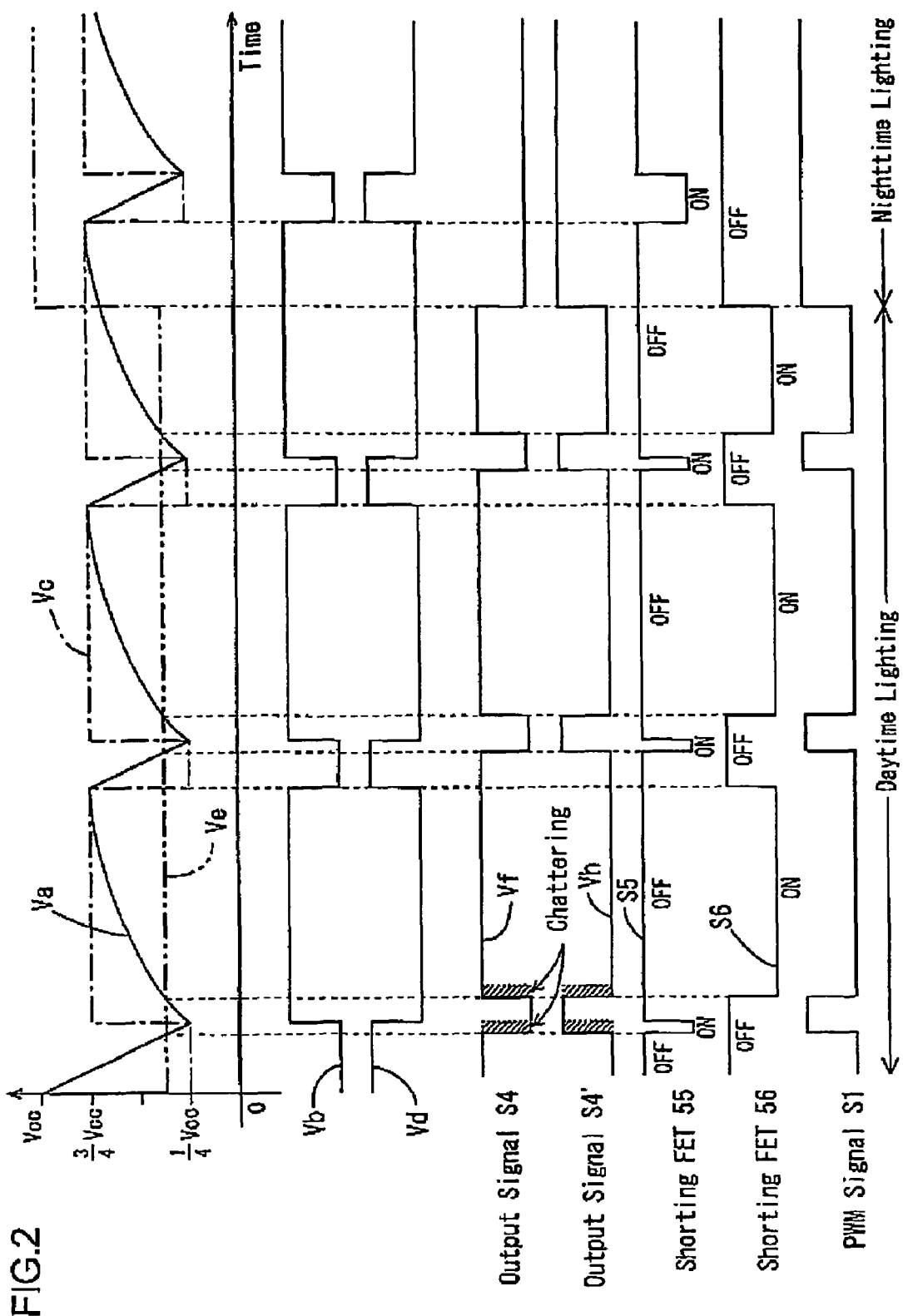
[FIG. 2] is a timing chart of an oscillator signal, a reference signal and voltage levels at various points.
Figure 3:
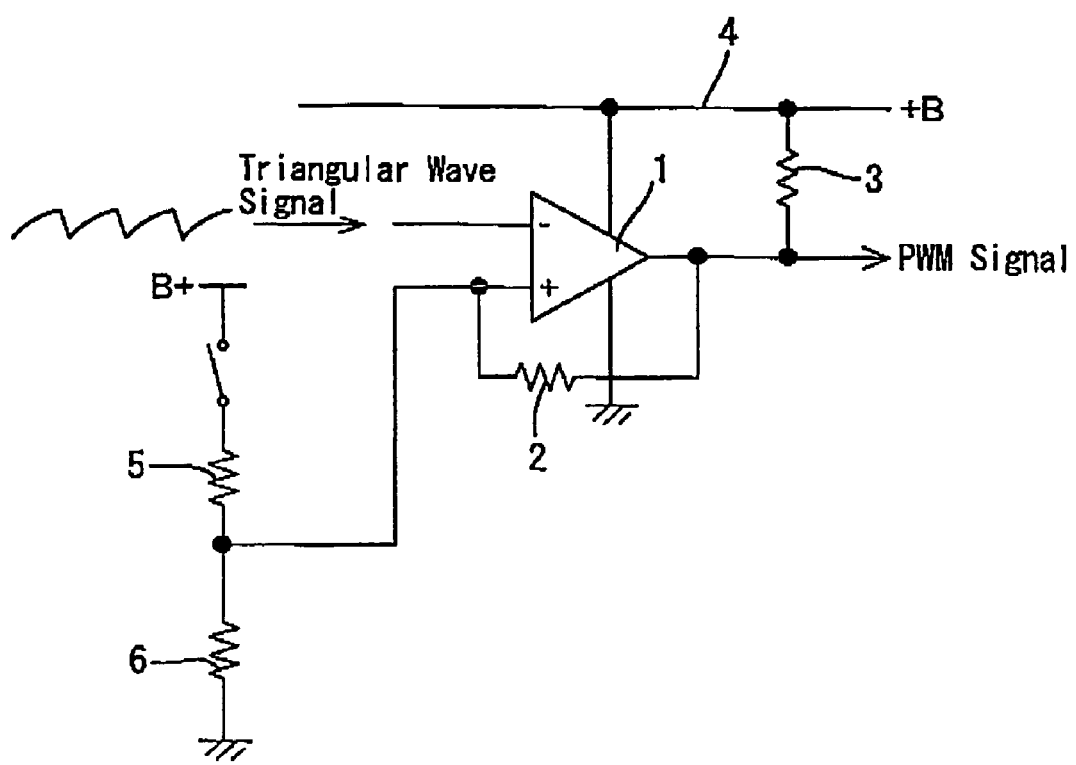
[FIG. 3] is a circuit diagram showing a typical PWM signal generator having a hysteresis comparator.

FIG. 1 is a schematic diagram showing the PWM signal generator 10 according to the present embodiment. As shown in the figure, the PWM signal generator 10 mainly includes a frequency control circuit 11 for outputting an oscillator signal S2, a switching circuit 12 for switching between daytime lighting described below and nighttime lighting or the like, a leakage current cutoff circuit 13, and a duty ratio control circuit 14.

(1) Frequency Control Circuit

The frequency control circuit 11 (i.e., an example of "an oscillator circuit" of the present invention) includes a comparator 20 (or alternatively an operational amplifier). The negative input terminal of the comparator 20 is connected to the higher potential terminal (Vcc) of a power source (e.g., a battery) via a parallel circuit 27 of a capacitor 21 as a frequency determination element and a resistor R1. That is, a voltage signal of a level corresponding to the interterminal voltage of the capacitor 21 is applied to the negative input terminal of the comparator 20. Hereinafter, a voltage level at point "A" connected to the negative input terminal of the comparator 20 is referred to as "Va". Note that a signal corresponding to the voltage level Va at point "A" is provided as an oscillator signal S2 for the duty ratio control circuit 14.

On the other hand, a divided potential of a voltage-dividing circuit, which includes voltage-dividing resistors R2 and R3 serially connected between the higher potential terminal and the lower potential terminal (GND) of the power source, is applied to the positive input terminal of the comparator 20. Further the output B of the comparator 20 is fed back to the positive input terminal via a feedback resistor R4. That is, a voltage signal of a level depending on the resistance values of the voltage-dividing resistors R2, R3 and the feedback resistor R4 is applied to the positive input terminal of the comparator 20. Hereinafter a voltage level at point "C" connected to the positive input terminal of the comparator 20 is referred to as "Vc".

The output of the comparator 20 is provided forward to a NOT circuit 22. On the other hand, the lower potential side of the parallel circuit 27 is connected to the lower potential terminal side of the power source via serially connected three n-channel FETs 23, 24, 25 and a resistor R5. A voltage signal corresponding to the output D of the NOT circuit 22 is applied to the gate of the higher-potential-side FET 23 of the FETs.

The FET 24 forms a current mirror circuit 28 together with an n-channel FET 26. The gate and drain of the FET 26 are short connected, and the drain is connected to the higher potential terminal of the power source via a resistor R6 (corresponding to "a resistive element" of the present invention).

(2) Switching Circuit And Leakage Current Cutoff Circuit

The switching circuit 12 includes a pair of PNP transistors 30, 31. The emitter of the transistor 30 is connected to the higher potential terminal side of the power source, while the collector is connected to the lower potential terminal side of the power source via a pair of voltage-dividing resistors R7, R8. The emitter of the transistor 31 is connected to the higher potential terminal side of the power source, while the collector is connected to the connecting point E between the voltage-dividing resistors R7, R8. A signal corresponding to the voltage level Ve at the connecting point E is provided as a reference signal S3 for the duty ratio control circuit 14. The signal corresponding to the voltage level Ve at the connecting point E is also provided to the gate of the FET 25.

The transistor 31 turns on, when a signal for instruction of "nighttime lighting", e.g., lighting of headlamps with a duty ratio of 100%, is received from an operating portion not shown of the vehicle. The transistor 30 turns on, when a signal for instruction of "daytime lighting (daylight)", e.g., lighting of headlamps with a duty ratio of 25% (i.e., an example of "a desired duty ratio" of the present invention), is received. The FET 25 turns on when one of the transistors 30, 31 is on, and turns off when both of the transistors 30, 31 are off. That is, when the headlamps are in a state such as an OFF state other than nighttime lighting or daytime lighting, the FET 25 turns off so as to provide a function for preventing a leakage current.

(3) Duty Ratio Control Circuit

The duty ratio control circuit 14 includes a comparator 50 (i.e., an example of "a comparator circuit" of the present invention). The comparator 50 includes a first FET 51 of p-channel type (i.e., an example of "a first current control element" of the present invention), which is connected to the positive input terminal of the comparator 50 and switches between on and off in response to the oscillator signal S2, and further includes a second FET 52 of p-channel type (i.e., an example of "a second current control element" of the present invention), which is connected to the negative input terminal of the comparator 50 and switches between on and off in response to the reference signal S3.

The source of the first FET 51 is connected to a constant current source 60, while the drain is connected to the connecting point between the FET 24 and the FET 25 via an n-channel FET 53. On the other hand, the source of the second FET 52 is also connected to the constant current source 60, while the drain is connected to the connecting point between the FET 24 and the FET 25 via an n-channel FET 54. The FET 53, of which gate and drain are short connected, forms a current mirror circuit together with the FET 54.

An output signal S4, which is level-inverted depending on a magnitude relation between the levels of the oscillator signal S2 and the reference signal S3, is provided to a NOT circuit 57. The NOT circuit 57 outputs a level-inverted output signal S4' as a PWM signal S1. Hereinafter, a voltage level at the output point F of the comparator 50 is referred to as "Vf", while a voltage level at the output point H of the NOT circuit 57 is referred to as "Vh".

In the present embodiment, a first shorting FET 55 of p-channel type (i.e., an example of "a first shorting switching element" of the present invention) is connected in parallel to the first FET 51. The first shorting FET 55 turns on when a control signal S5 of low level is received on the gate thereof, so as to provide a function for forming short connection between the source and drain of the first FET 51. Further, a second shorting FET 56 of p-channel type (i.e., an example of "a second shorting switching element" of the present invention) is connected in parallel to the second FET 52. The second shorting FET 56 turns on when a control signal S6 of low level is received on the gate thereof, so as to provide a function for forming short connection between the source and drain of the second FET 52.

The PWM signal generator 10 includes a pair of NAND circuits 58, 59. A voltage level Vd at the output D of the NOT circuit 22 and a voltage level Vh at the output point H of the NOT circuit 57 are applied to the inputs of the NAND circuit 58. The output thereof is applied to the gate of the first shorting FET 55. On the other hand, a voltage level Vb at the output point B of the comparator 20 and a voltage level Vf at the input point F of the NOT circuit 57 are applied to the inputs of the NAND circuit 59. The output thereof is applied to the gate of the second shorting FET 56.

This is the end of the circuit construction of the PWM signal generator 10. Note that, in the present embodiment, the circuits are configured onto a single chip 70, except for the capacitor 21 and the resistor R1, provided for determining the oscillating frequency of the frequency control circuit 11, and the switching circuit 12. Therefore the frequency of an oscillator signal S2 can be adjusted by changing the capacitor 21 and the resistor R1 disposed outside of the chip 70. Further the duty ratio of a PWM signal S1 can be adjusted by changing the voltage-dividing resistors R7 and R8.

2. Operation of the Present Embodiment (1) Frequency Control Circuit

When power is supplied to the PWM signal generator 10 and a nightlight signal or a daylight signal is inputted to the switching circuit 12, the FET 25 turns on. At the beginning, point "A" connected to the negative input terminal of the comparator 20 is on the side of the higher potential terminal voltage Vcc of the power source, and the comparator 20 is off, that is, the voltage Vb at the output point B of the comparator 20 is low level. Therefore the FET 23 turns on in response to a voltage signal Vd of high level from the NOT circuit 22. Thereby a current passes from the power source through the parallel circuit 27, the FETs 23, 24, 25 and the resistor R5, and charging of the capacitor 21 begins.

The FETs 24, 26 form a current mirror circuit 28 as described above. Therefore the amount of a current i1 passing through the FETs 23, 24 depends on the amount of a current i2 passing through the resistor R6 and the FET 26, that is, depends on the higher potential Vcc of the power source. If the higher potential Vcc of the power source decreases due to fluctuation of the power supply voltage or the like, the amount of the charging current i1 for the capacitor 21 decreases accordingly. Conversely, when the higher potential Vcc of the power source increases, the amount of the charging current i1 for the capacitor 21 increases accordingly. As a result, the charging time for the capacitor 21, i.e., the frequency of the oscillator signal S2 at point "A", can be stable with immunity from fluctuation of the higher potential Vcc of the power source.

At the time, the voltage level Vb at the output point B of the comparator 20 is almost equal to the lower potential GND of the power source. In the present embodiment, the resistance values of the voltage-dividing resistors R2, R3 are equal to each other, and the resistance value of the feedback resistor R4 is set to a half of that of the voltage-dividing resistor R2 (or R3), for example. Therefore, as shown in (the uppermost field of the timing chart of) FIG. 2, the voltage level Vc at point "C" is equal to ¼ Vcc, which is applied to the positive input terminal of the comparator 20.

Thereafter the voltage level Va at point "A" gradually decreases as the charging of the capacitor 21 proceeds. When the voltage level falls below ¼ Vcc, the voltage level Vb at the output point B of the comparator 20 is level-inverted to a high level (See the figure (the second field from the top in the timing chart)). This causes the FET 23 to turn off, so that the charging of the capacitor 21 suspends and discharging begins. At this time, the voltage level Vb at the output point B of the comparator 20 is almost equal to the higher potential Vcc of the power source. Therefore, as shown in (the uppermost field of the timing chart of) FIG. 2, the voltage level Vc at point "C" is equal to ¾ Vcc, which is applied to the positive input terminal of the comparator 20.

Thereafter the voltage level Va at point "A" gradually increases as the discharging of the capacitor 21 proceeds. When the voltage level exceeds ¾ Vcc, the comparator 20 returns off (See the figure (the second field from the top in the timing chart)) and thereby the voltage level Vb at the output point B is level-inverted to a low level. Thus the voltage level Va at point "A" is level-inverted between ¼ Vcc and ¾ Vcc so as to vary in triangular wave pattern, which is applied as an oscillator signal S2 to the positive input terminal (i.e., the gate of the first FET 51) of the comparator 50 of the duty ratio control circuit 14.

(2) Duty Ratio Control Circuit

In the duty ratio control circuit 14, the oscillator signal S2 from the frequency control circuit 11 is inputted to the positive input terminal of the comparator 50, while the voltage level Ve at the connecting point E is provided to the negative input terminal thereof from the switching circuit 12. In the present embodiment, the resistance values of the resistors R7, R8 are set, so that the voltage level Ve at the connecting point E when the switching circuit 12 receives a daylight signal is adjusted to a level (between ¼ Vcc and ¾ Vcc, but closer to ¼ Vcc) shown in (the uppermost field of the timing chart of) FIG. 2. More specifically, that is adjusted so that the duty ratio of the PWM signal S1 is 25%, for example. As shown in (the uppermost field of the timing chart of) FIG. 2, a time when the magnitude relation between the level of the oscillator signal S2 and the voltage level Ve is inverted during a normal time when a power-supply noise or the like has not occurred (i.e., a time corresponding to a duty ratio of 25%) corresponds to "a proper time according to a desired duty ratio" and "a time when the output signal is subsequently level-inverted" of the present invention.

When the level of the oscillator signal S2 exceeds the voltage level Ve of the connecting point E, the first FET 51 of the comparator 50 is off, and the voltage level Vf at the output point F of the comparator 50 is high level. On the other hand, when the level of the oscillator signal S2 falls below the voltage level Ve of the connecting point E, the first FET 51 turns on, and the voltage level Vf at the output point F of the comparator 50 is level-inverted to a low level. Thereby the voltage level Vf at the output point F of the comparator 50 pulses in rectangular wave pattern as shown in FIG. 2 (i.e., in the fourth field from the top in the timing chart).

However, the level of the reference signal S3 (i.e., the voltage level Ve at the connection E) from the switching circuit 12 may fluctuate due to a noise or the like during vehicle acceleration or deceleration, for example. In this case, chattering will occur at the time of level inversion between the level of the oscillator signal S2 and the level of the reference signal S3 (See FIG. 2 (the fourth and fifth fields from the top in the timing chart)). Thereby the duty ratio of the PWM signal S1 will fluctuate, and the stable PWM control for daytime lighting may not be provided.

For this reason, according to the present embodiment, the first and second shorting FETs 55, 56 are provided in the comparator 50 as described above. The first shorting FET 55 turns on, when a low-level signal, which is outputted when the voltage level Vd at the output D of the NOT circuit 22 and the voltage level Vh at the output point H of the NOT circuit 57 are both high level, is received from the NAND circuit 58. Otherwise a high-level signal is received, and therefore the first shorting FET 55 is off. That is, the first shorting FET 55 is on (i.e., performing a shorting operation) until the changing trend of the oscillator signal S2 is inverted (i.e., inverted from a downward trend to an upward trend) after the level of the oscillator signal S2 falls below the level of the reference signal S3, as shown in FIG. 2 (i.e., in the sixth field from the top in the timing chart). Otherwise the first shorting FET 55 is off (i.e., in a non-shorting state).

According to this construction, the first shorting FET 55 short-connects between the drain and source of the first FET 51 disposed on the positive input terminal side, when the level of the oscillator signal S2 falls below the level of the reference signal S3. Thereby a higher current passes through the FET 54, which forms a current mirror circuit together with the FET 53 connected to the first FET 51. Therefore, in this case, the voltage level Vf at the output point F of the comparator 50 is forcibly maintained at a low level, even if the level of the reference signal S3 fluctuates. Thus level-inversion can be inhibited. The capacitor 21 is being charged at this time. Therefore the voltage level Va at point "A" is decreasing, and a current passing through the first FET 51 is increasing. The current passing through the first FET 51 (i.e., a current corresponding to the level of the oscillator signal S2) also passes through the FETs 53, 54. When the first shorting FET 55 is turned on, a current, higher than the current passing through the first FET 51 when the first shorting FET 55 is off, passes through the FETs 53, 54. This means that a level to be compared with the level of the reference signal S3 by the comparator 50 is changed irrespective of the level of the oscillator signal S2 so that the voltage level Vf at the output point F is not level-inverted. This corresponds to the phrase "changing, irrespective of a signal level of one of the oscillator signal and the reference signal, a level to be compared with a level of the other signal by the comparator circuit, so that the output signal is not level-inverted" of the present invention.

On the other hand, the second shorting FET 56 turns on, when a low-level signal, which is outputted when the voltage level Vb at the output point B of the comparator 20 and the voltage level Vf at the input point F of the NOT circuit 57 are both high level, is received from the NAND circuit 59. Otherwise a high-level signal is received, and therefore the second shorting FET 56 is off. That is, the second shorting FET 56 is on (i.e., performing a shorting operation) until the changing trend of the oscillator signal S2 is inverted (i.e., inverted from an upward trend to a downward trend) after the level of the oscillator signal S2 exceeds the level of the reference signal S3, as shown in FIG. 2 (i.e., in the seventh field from the top in the timing chart). Otherwise the second shorting FET 56 is off (i.e., in a non-shorting state).

Thus the second shorting FET 56 short-connects between the drain and source of the second FET 52 disposed on the negative input terminal side, when the level of the oscillator signal S2 exceeds the level of the reference signal S3. Therefore, in this case, the voltage level Vf at the output point F of the comparator 50 is forcibly maintained at a high level, even if the level of the reference signal S3 fluctuates. Thus level-inversion is inhibited. The capacitor 21 is being discharged at this time. Therefore the voltage level Va at point "A" is increasing, and a current passing through the first FET 51 is decreasing. On the other hand, a current corresponding to the level of the reference signal S3 passes through the second FET 52. When the second shorting FET 56 turns on, a current, higher than the current passing through the second FET 52 when the second shorting FET 56 is off, passes through the second shorting FET 56. This means that a level to be compared with the level of the oscillator signal S2 by the comparator 50 is changed irrespective of the level of the reference signal S3 so that the voltage level Vf at the output point F is not level-inverted. This corresponds to the phrase "changing, irrespective of a signal level of one of the oscillator signal and the reference signal, a level to be compared with a level of the other signal by the comparator circuit, so that the output signal is not level-inverted" of the present invention. As observed above, the NAND circuits 58, 59 function as "a trend-inversion detector circuit" and "a shorting control circuit" of the present invention, and further forms "a level-inversion inhibiting circuit" of the present invention together with the first and second shorting FETs 55, 56.

(3) Switching Circuit And Leakage Current Cutoff Circuit

The operation during daytime lighting has been explained above. In the case of switching to nighttime lighting, a night-light signal is provided for the switching circuit 12. Thereby the transistor 30 turns off, and the transistor 31 turns on. Then the level of the reference signal S3 (i.e., the voltage level Ve at the connection E) becomes almost equal to the higher potential Vcc of the power source, as shown in the right side of (the uppermost field of the timing chart of) FIG. 2. Therefore the level of the reference signal S3 continuously exceeds the level of the oscillator signal S2. Thereby nighttime lighting is performed with a duty ratio of 100%.

In the case that lighting of headlamps is not required, the transistors 30, 31 of the switching circuit 12 are both turned off. Then the FET 25 also turns off, and thereby a leakage current from the power source 80 can be cut off during an OFF state.

According to the present embodiment, switching between nighttime lighting and daytime lighting of headlamps, and leakage current cutoff during an OFF state of headlamps are thus achieved by switching control using the switching circuit 12.

3. Effects of the Present Embodiment (1) According to the present embodiment, after the output signal S4 (and also the output signal S4') are level-inverted, the inverted state thereof is maintained by the first and second shorting FETs 55, 56 provided as a level-inversion inhibiting circuit. Thereafter the inhibition of level-inversion is automatically released, when the changing trend of the oscillator signal S2 inverts. Thereby chattering can be prevented, even if the level of the reference signal S3 fluctuates due to a noise or the like during vehicle acceleration, for example. Further, according to the present embodiment, in contrast to a conventional construction utilizing a hysteresis comparator, the level of the reference signal S3 is determined mainly depending upon the voltage-dividing resistors R7, R8 provided in the switching circuit 12, that is, substantially not affected by the resistor components in the comparator 50. The voltage-dividing resistors R7, R8 are provided as external resistors, and therefore those having appropriate resistance values can be selected even after the PWM signal generator 10 has been manufactured. Consequently, a PWM signal S1 having a stable duty ratio can be generated, even if circuit constants have variations due to manufacturing reasons (See FIG. 2 (the lowermost field of the timing chart)).

(2) Further, the NAND circuit 58 detects when the changing trend of the oscillator signal S2 inverts after the level of the oscillator signal S2 falls below the level of the reference signal S3, and releases the shorting operation of the first shorting FET 55 at the time of the detection. That is, inhibition of level-inversion is released then. On the other hand, the NAND circuit 59 detects when the changing trend of the oscillator signal S2 inverts after the level of the oscillator signal S2 exceeds the level of the reference signal S3, and releases the shorting operation of the second shorting FET 56 at the time of the detection. That is, inhibition of level-inversion is released then. Thus release of inhibition of level-inversion can be achieved without using a timer or the like.

Other Embodiments

The present invention is not limited to the embodiment explained in the above description made with reference to the drawings, but the following embodiments may be included in the technical scope of the present invention, for example.

(1) The above FETs 23-25, 51-56 may be bipolar transistors.

(2) The transistors 30, 31 may be unipolar transistors such as FETs.

(3) The level-inversion inhibiting circuit may have a construction, for example, in which the level of the reference signal S3 or the level of the oscillator signal S2 applied to the comparator 50 is forcibly pulled up or pulled down, instead of the construction according to the above embodiment.

(4) In the above embodiment, the comparator 50 is used as a comparator circuit. However, the present invention is not limited to this construction. An operational amplifier can be used instead. In this case, the respective shorting switching elements of the present invention can be connected in parallel to a pair of switching elements constituting a push-pull circuit of the operational amplifier.

(5) In the above embodiment, a pull-down type oscillator circuit (which outputs an oscillator signal based on the potential of the lower potential terminal of the capacitor 21) is used. However, a pull-up type oscillator circuit (which outputs an oscillator signal based on the potential of the higher potential terminal of the capacitor 21) can be used instead. In the case of the pull-down type like the above embodiment wherein a reference signal is generated based on the lower potential side of the oscillating range, there is an advantage of a shorter time period of the possibility of chattering, because the waveform of the oscillator signal is precipitous as for that side.

(6) The above embodiment may be modified to a construction, in which the level to be compared in magnitude to the level of an oscillator signal by a comparator circuit is forcibly changed to an absolutely lower level than the level of the oscillator signal irrespective of the level of a reference signal when the level of the oscillator signal exceeds the level of the reference signal, or a construction, in which the level to be compared in magnitude to the level of a reference signal by the comparator circuit is forcibly changed to an absolutely lower level than the level of the reference signal irrespective of the level of an oscillator signal when the level of the oscillator signal falls below the level of the reference signal, for example.

The invention claimed is:

1. A PWM signal generator comprising:
an oscillator circuit configured to output an oscillator signal;
a comparator circuit configured to receive said oscillator signal from said oscillator circuit and a reference signal, and further configured to output an output signal of a pulse train, which is level-inverted according to a magnitude relation between a level of said oscillator signal and a level of said reference signal, as a PWM signal for pulse width modulation control; and
a level-inversion inhibiting circuit configured to inhibit level-inversion of said output signal, until a time before said output signal is subsequently level-inverted at a proper time according to a desired duty ratio of said PWM signal after said output signal is level-inverted, by changing, irrespective of a signal level of one of said oscillator signal and said reference signal, a level to be compared with a level of the other signal by said comparator circuit, so that said output signal is not level-inverted.

2. A PWM signal generator as in claim 1, further comprising:
a trend-inversion detector circuit configured to detect inversion of changing trend of said oscillator signal from said oscillator circuit;
wherein said level-inversion inhibiting circuit releases inhibition of level inversion of said output signal, if said trend-inversion detector circuit detects inversion of changing trend of said oscillator signal.

3. A PWM signal generator as in claim 1, wherein:
said comparator circuit includes a first current control element through which a current corresponding to a level of said oscillator signal passes, and a second current control element through which a current corresponding to a level of said reference signal passes; and
said level-inversion inhibiting circuit includes:
a first shorting switching element being connected in parallel to said first current control element;
a second shorting switching element being connected in parallel to said second current control element; and
a shorting control circuit configured to turn said first shorting switching element into a shorting state when said output signal is level-inverted during an upward trend of the current passing through said first current control element, and turn said second shorting switching element into a shorting state when said output signal is level-inverted during a downward trend of the current passing through said first current control element.

4. A PWM signal generator as in claim 2, wherein:
said comparator circuit includes a first current control element through which a current corresponding to a level of said oscillator signal passes, and a second current control element through which a current corresponding to a level of said reference signal passes; and
said level-inversion inhibiting circuit includes:
a first shorting switching element being connected in parallel to said first current control element;
a second shorting switching element being connected in parallel to said second current control element; and
a shorting control circuit configured to turn said first shorting switching element into a shorting state when said output signal is level-inverted during an upward trend of the current passing through said first current control element, and turn said second shorting switching element into a shorting state when said output signal is level-inverted during a downward trend of the current passing through said first current control element.

5. A PWM signal generator as in claim 1, wherein said oscillator circuit includes:
a capacitor as a frequency determination element for determining an oscillating frequency;
a resistive element being connected to a power source; and
a current mirror circuit into which a current from said power source passes via said resistive element, wherein a mirror current from said current mirror circuit passes into said capacitor so as to charge and discharge said capacitor.

6. A PWM signal generator as in claim 2, wherein said oscillator circuit includes:
a capacitor as a frequency determination element for determining an oscillating frequency;
a resistive element being connected to a power source; and
a current mirror circuit into which a current from said power source passes via said resistive element, wherein a mirror current from said current mirror circuit passes into said capacitor so as to charge and discharge said capacitor.

7. A PWM signal generator as in claim 3, wherein said oscillator circuit includes:

a capacitor as a frequency determination element for determining an oscillating frequency;

a resistive element being connected to a power source; and a current mirror circuit into which a current from said power source passes via said resistive element, wherein a mirror current from said current mirror circuit passes into said capacitor so as to charge and discharge said capacitor.

8. A PWM signal generator as in claim 4, wherein said oscillator circuit includes:

a capacitor as a frequency determination element for determining an oscillating frequency;

a resistive element being connected to a power source; and a current mirror circuit into which a current from said power source passes via said resistive element, wherein a mirror current from said current mirror circuit passes into said capacitor so as to charge and discharge said capacitor.

* * * * *